(12) United States Patent
Chen et al.

(10) Patent No.: US 6,930,923 B2
(45) Date of Patent: Aug. 16, 2005

(54) FLASH MEMORY CAPABLE OF UTILIZING ONE DRIVING VOLTAGE OUTPUT CIRCUIT TO DRIVE A PLURALITY OF WORD LINE DRIVERS

(75) Inventors: Yin-Chang Chen, Hsin-Chu Hsien (TW); Ting-Kuo Yen, Miao-Li Hsien (TW)

(73) Assignee: AMIC Technology Corporation, Hsin-Chu (TW)

(*) Notice: Subject to any disclaimer, the term of this patent is extended or adjusted under 35 U.S.C. 154(b) by 106 days.

(21) Appl. No.: 10/605,759

(22) Filed: Oct. 23, 2003

(65) Prior Publication Data
US 2005/0013166 A1 Jan. 20, 2005

(30) Foreign Application Priority Data
Jul. 17, 2003 (TW) ........................... 92119571 A (51) Int. Cl.$^7$ ............................................. G11C 16/00
(52) U.S. Cl. ............................... 365/185.23; 365/185.11; 365/189.11
(58) Field of Search ................... 365/185.23, 185.11, 365/185.33, 189.11

(56) References Cited

U.S. PATENT DOCUMENTS

| | | | | |
|---|---|---|---|---|
| 5,270,980 A | * | 12/1993 | Pathak et al. | 365/185.12 |
| 5,604,711 A | * | 2/1997 | Cheung | 365/230.06 |
| 5,652,450 A | * | 7/1997 | Hirano | 257/323 |
| 5,822,252 A | * | 10/1998 | Lee et al. | 365/185.3 |
| 6,181,606 B1 | * | 1/2001 | Choi et al. | 365/185.23 |

* cited by examiner

Primary Examiner—Tan T. Nguyen
(74) Attorney, Agent, or Firm—Winston Hsu (57) ABSTRACT

A flash memory capable of utilizing one driving voltage output circuit to drive a plurality of word line drivers. The flash memory has a row driver for driving a predetermined word line to approach a predetermined voltage level. The row driver has a plurality of word line drivers, and each word line driver has a plurality of driving units and a driving voltage output circuit. The driving voltage output circuit is used for determining operating voltage levels of a plurality of driving voltages according to a plurality of second decoded signals without utilizing a plurality of first decoded signals, and for outputting a predetermined driving voltage to drive the predetermined word line to approach the predetermined voltage level when a driving unit electrically connected to the predetermined word line is turned on for connecting the predetermined word line and the driving voltage output circuit.

14 Claims, 8 Drawing Sheets

FLASH MEMORY CAPABLE OF UTILIZING ONE DRIVING VOLTAGE OUTPUT CIRCUIT TO DRIVE A PLURALITY OF WORD LINE DRIVERS

BACKGROUND OF INVENTION

1. Field of the Invention

The present invention relates to a flash memory. In particular, the present invention discloses a flash memory capable of utilizing one driving voltage output circuit to drive a plurality of word drivers.

2. Description of the Prior Art

Recently, demand for portable devices has been boosted incredibly. The technology and application fields associated with the flash memory are accordingly developed. These portable devices include films of digital cameras, cellular phones, video game apparatus, personal digital assistants, answering machines, programmable ICs, and etc. The flash memory is a non-volatile memory, and the flash memory operates through adjusting a threshold voltage for effecting formation of a channel when storing data. Therefore, not only are the data stored, but also the data kept in the flash memory do not need to be flushed after the flash memory is disconnected from a power supply.

Figure 1:
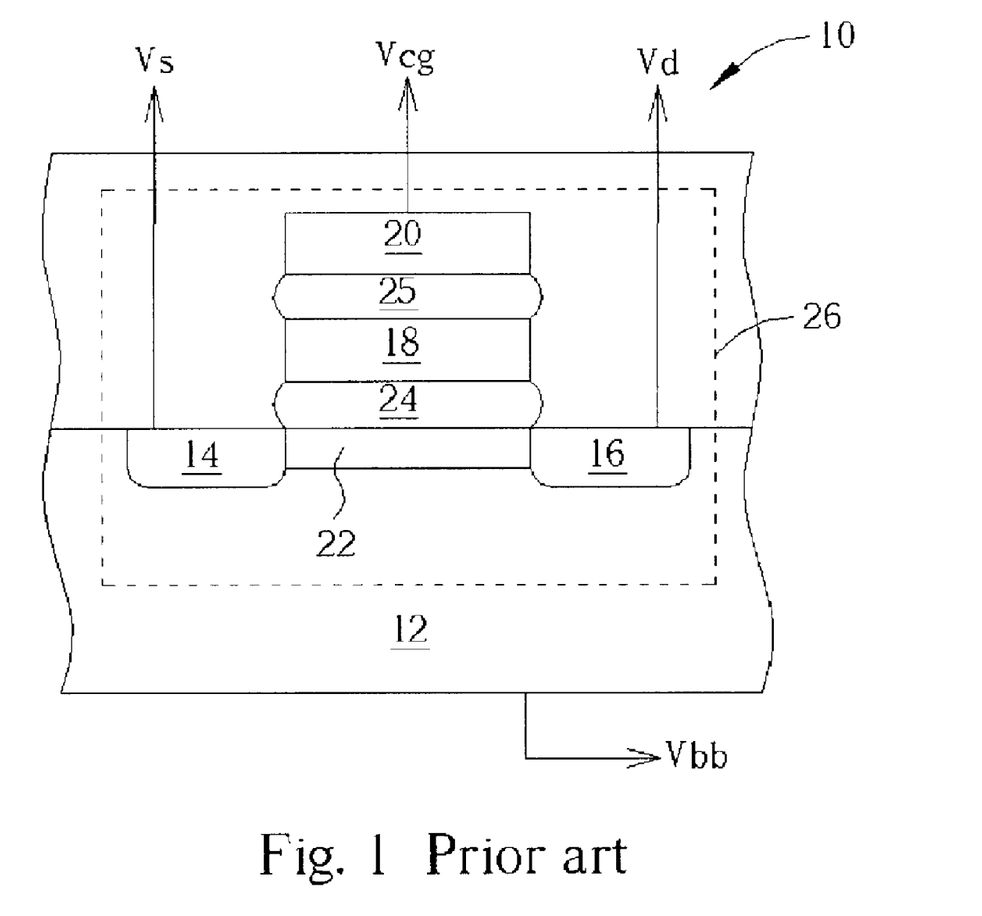
FIG. 1 is a structure diagram of a prior art flash memory.

Please refer to FIG. 1, which is a structure diagram of a prior art flash memory 10. The flash memory 10 has a substrate 12, a source 14, a drain 16, a floating gate 18, and a control gate 20. A channel 22 induced between the floating gate 18 and the substrate 12 is isolated from the floating gate 18 through an oxide layer 24. Furthermore, another oxide layer 25 isolates the control gate 20 and the floating gate 18. The substrate 12 is electrically connected a reference voltage Vbb. If the flash memory 10 has an NMOS-based structure, the substrate 12 is a p-doped area, and the source 14 and the drain 16 are n-doped areas. On the contrary, if the flash memory 10 has a PMOS-based structure, the substrate 12 is an n-doped area, and the source 14 and the drain 16 are p-doped areas. Please note that only one memory cell 26 is shown in FIG. 1 for simplicity. However, the flash memory 10 generally has many memory cells 26 indexed by rows and columns. That is, a memory cell 26 located at an intersection of one row and one column corresponds to a memory address for storing data.

The operation of the flash memory 10 is described as follows. Taking the flash memory 10 with the NMOS-based structure for example, the control voltage Vcg inputted to the control gate 20 is capable of altering a total amount of electrons stored on the floating gate 18. Therefore, the electrons stored on the floating gate 18 can be used to adjust the threshold voltage associated with formation of the channel 22. When a reading operation is performed, data bit stored by the memory cell 26 is detected to be "1" or "0" according to the total amount of electrons stored on the floating gate 18. When the floating gate 18 keeps much more electrons, the threshold voltage associated with the channel 22 is increased owing to negative polarity provided by the floating gate 18. That is, a voltage level of the control gate 20 needs to be pumped to a higher positive voltage to overwhelm a negative voltage level provided by the floating gate 18 for inducing the channel 22 on the substrate 12. On the contrary, when the floating gate 18 keeps fewer electrons or no electrons, the threshold voltage associated with formation of the channel 22 is accordingly low. Generally speaking, in order to conduct the source 14 and the drain 16, that is, to induce the channel 22 between the source 14 and the drain 16 for performing the reading operation, the control voltage Vcg is applied to the control gate 20. Then, the current passing through the source 14 and the drain 16 is measured to determine whether the data bit stored by the memory cell 26 is "1" or "0".

Operations associated with the flash memory 10 are divided into a programming operation, a reading operation, and an erasing operation. Taking the flash memory 10 having the NMOS-based structure for example, the reference voltage Vbb electrically connected to the substrate 12 corresponds to a grounding voltage (0V for instance), the control voltage Vcg electrically connected to the control gate 20 corresponds to a positive voltage (+8.5V for instance), the control voltage Vs electrically connected to the source 14 corresponds to the grounding voltage, and the control voltage Vd electrically connected to the drain 16 corresponds to a positive voltage (+5V for instance) when the programming operation is started. The channel 22 is successfully induced now to connect the drain 16 and the source 14, and electrons flow from the source 14 to the drain 16. Because a voltage difference between the drain 16 and the source 14 is great, a strong electric field is established to drive electrons within the channel 22, and well-known channel hot electrons are accordingly induced. When the energy of the channel hot electrons is high enough to overcome a potential barrier established by the oxide layer 24, the control gate 20 then attracts the energized channel hot electrons to the floating gate 18. That is, the floating gate 18 is programmed to store a predetermined amount of electrons through the programming operation. With regard to the memory cell 26 without being programmed, the grounding voltage is used to drive the control gate 20 so that the channel 22 is impossible to be induced. In other words, the floating gate 18 is unable to store a predetermined amount of electrons.

With regard to the reading operation, the reference voltage Vbb inputted to the substrate 12 corresponds to a grounding voltage (0V for instance), the control voltage Vcg inputted to the control gate 20 corresponds to a positive voltage (+3.3V for instance), and the control voltage Vd inputted to the drain 16 corresponds to a positive voltage (+1V for instance). If the floating gate 25 now has kept a predetermined amount of electrons through the above-mentioned programming operation, the control voltage Vcg is not high enough to make the channel 22 induced in the substrate 12. Therefore, the source 14 and the drain 16 are not capable of conducting current successfully. On the contrary, if the floating gate 25 does not keep a predetermined amount of electrons through the above-mentioned programming operation yet, the control voltage Vcg is high enough to induce the channel 22 within the substrate 12. Therefore, the source 14 is successfully connected to the drain 16 with the help of the induced channel 22. In other words, current is successfully passed through the source 14 and the drain 16. In the end, a prior art sense amplifier is activated to determine the logic value ("1" or "0") recorded by the memory cell 26 according to magnitude of the passing current.

With regard to the erasing operation, the reference voltage Vbb electrically connected to the substrate 12 corresponds to a positive voltage (+8.5V for example), the control voltage Vcg electrically connected to the control gate 20 corresponds to a negative voltage (−7V for example), the control voltage Vs electrically connected to the source 14 corresponds to a grounding voltage (0V for example), and the drain 16 is floating. If the floating gate 25 has stored a predetermined amount of electrons, the electric field established between the control gate 20 and the substrate 12 will expel the electrons out of the floating gate 25. In other words, a well-known Fowler-Nordheim tunning effect occurs to remove the electrons on the floating gate 25 and the expelled electrons are drained out through the drain 14.

As mentioned above, the control gate 20 needs to be driven by a suitable control voltage Vcg no matter if the flash memory 10 performs the programming operation, the reading operation, or the erasing operation. Generally speaking, the control gate 20 is electrically connected to a word line. Therefore, a driving circuit is necessary to provide the word line with an appropriate operating voltage. Please refer to FIG. 2, which is a circuit diagram of the flash memory 10 shown in FIG. 1. The flash memory 10 has a first decoder 32, a second decoder 34, a row driver 36, a power supply circuit 38, and a plurality of memory blocks 40a, 40b. The row driver 36 includes a plurality of word line drivers 42a, 42b, and each of the word line drivers 42a, 42b has a plurality of word lines $WL_0$–$Wl_n$. In addition, each of the word lines $WL_0$–$Wl_n$ is electrically connected to a plurality of memory cells 44. The first decoder 32 is used to decode a memory address ADDRESS for generating a first decoding signal XP. The first decoding signal XP is used to determine which word line driver 42a, 42b is selected. For example, the memory address ADDRESS corresponds to one memory cell 44 located at the memory block 40a. After the first decoder 32 decodes the memory address ADDRESS, the first decoder 32 acknowledges that the word line driver 42a needs to be activated for accessing the memory block 40a owing to the relationship between the memory address ADDRESS and the memory block 40a, and the first decoding signal XP is then issued by the first decoder 32 to select the wanted word line driver 42a.

Figure 2:
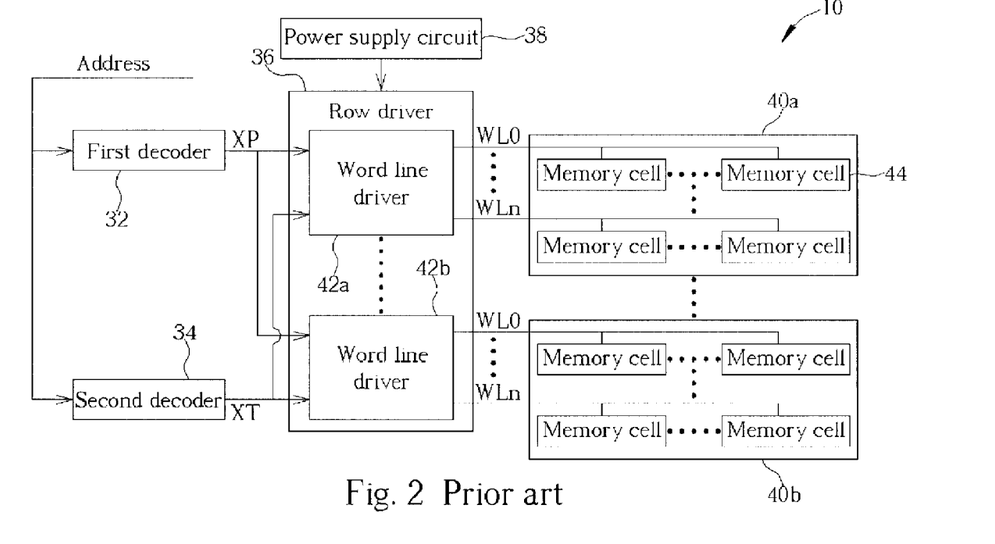
FIG. 2 is a circuit diagram of the flash memory shown in FIG. 1.

In addition, the second decoder 34 also decodes the memory address ADDRESS for generating a second decoding signal XT. The second decoding signal XT is used to determine which word line needs to be driven by a specific operating voltage for programming, reading, or erasing a predetermined memory cell. For instance, the memory address ADDRESS corresponds to a memory cell 44 located at the word line $WL_0$ within the memory block 40a. If the flash memory 10 starts a reading operation, the control gate of the memory cell, as mentioned above, needs to be driven by a voltage equaling +3.3V. Therefore, when the first decoding signal XP selects the word line driver 42a, and the second decoding signal XT selects the word line $WL_0$, the word line driver 42a is capable of driving the word line $WL_0$ to approach a voltage level equaling +3.3V.

The power supply circuit 38 is used to provide the row driver 36 with required operating voltages. For example, when the flash memory 10 performs the programming operation, the power supply circuit 38 outputs a voltage equaling +8.5V to the control gate of a memory cell 44 if the memory cell 44 needs to be programmed. On the contrary, if the memory cell 44 does not need to be programmed, the power supply circuit 38 outputs a voltage equaling 0V to the control gate of the memory cell 44. When the flash memory 10 performs the reading operation, the power supply circuit 38 outputs a voltage equaling +3.3V to the control gate of the memory cell 44 if the memory cell 44 needs to be read. On the contrary, if the memory cell 44 does not need to be read, the power supply circuit 38 outputs a voltage equaling 0V to the control gate of the memory cell 44. When the flash memory 10 performs the erasing operation, the power supply circuit 38 outputs a voltage equaling −7V to the control gate of the memory cell 44 for erasing data stored on the memory cell 44. To sum up, the power supply circuit 38 provides the row driver 36 with different voltage levels according to the programming operation, the reading operation, or the erasing operation currently run by the flash memory 10.

Figure 3:
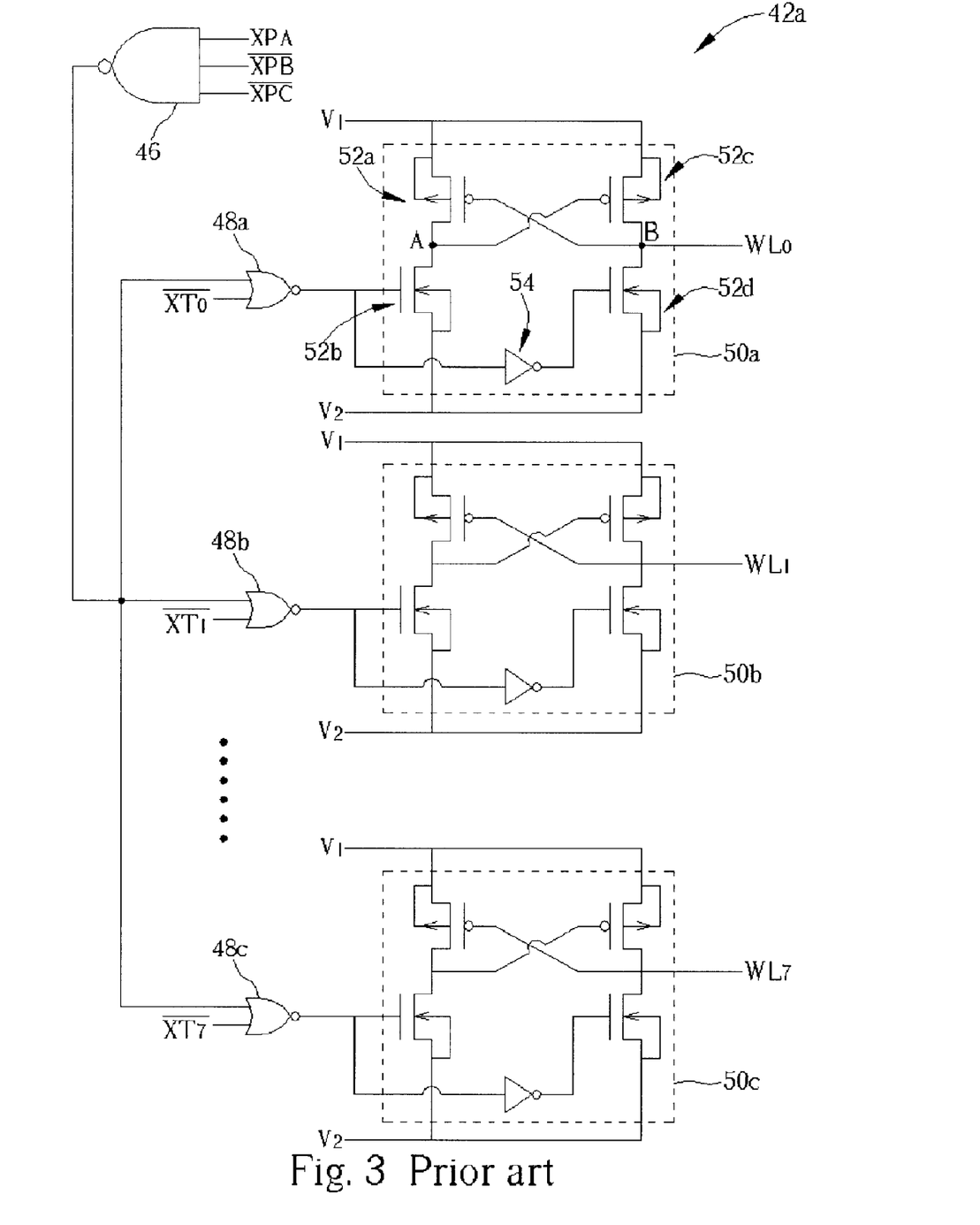
FIG. 3 is a circuit diagram of a word line driver shown in FIG. 2.

Please refer to FIG. 3, which is a circuit diagram of the word line driver 42a shown in FIG. 2. The word line driver 42a includes an NAND gate 46 and a plurality of NOR gates 48a, 48b, 48c. As mentioned above, the first decoding signal XP outputted from the first decoder 32 is used to select one word line driver within the roe driver 36. Suppose that the row driver 36 has 8 word line drivers, wherein the word line driver 42a is the $1^{st}$ word line driver, and the word line driver 42b is the $8^{th}$ word line driver. It is well-known that three decoding signals XPA, XPB, XPC can be used to select one word line driver out of 8 word line drivers. For example, the signals inputted into the NAND gate 46 are an inverted signal of the decoding signal XPA, an inverted signal of the decoding signal XPB, and an inverted signal of the decoding signal XPC respectively. Therefore, the word line driver 42a can be chosen successfully when all of the three decoding signals XPA, XPB, XPC correspond to the same logic value "0". Concerning each word line driver, the circuit structure is similar to that of the word line driver 42a. The only difference is that the signals inputted into the NAND gate 46. Taking the word line driver 42b for example, the signals inputted into the NAND gate 46 are decoding signals XPA, XPB, XPC. Therefore, the word line driver 42b can be chosen successfully when all of the three decoding signals XPA, XPB, XPC correspond to the same logic value "1".

To sum up, which word line driver being selected out of the 8 word line drivers depends on logic values of the decoding signals XPA, XPB, XPC. As shown in FIG. 3, each of the NOR gates 48a, 48b, 48c corresponds to a specific word line. That is, the word line drivers 42a has 8 NOR gates, wherein the NOR gate 48a corresponds to the word line $WL_0$, the NOR gate 48b corresponds to the word line $WL_1$, and the NOR gate 48c corresponds to the word line $WL_7$. The second decoding signal XT is used to determine which word line needs to be driven by an operating voltage for successfully programming, reading, or erasing a predetermined memory cell. Because the word line driver 42a shown in FIG. 3 has 8 word lines $WL_0$–$WL_7$, the second decoding signal XT comprises 8 decoding signals $XT_0$–$XT_7$ when the second decoder 34 outputs the second decoding signal XT. A logic value of each decoding signal $XT_0$–$XT_7$ is used to determine whether a corresponding word line is selected or not. For instance, if a control gate of the predetermined memory cell is electrically connected to the word line $WL_0$, the decoding signal $XT_0$ corresponds to the logic value "1" only, but remaining decoding signals $XT_1$–$XT_7$ correspond to the logic value "0". As shown in FIG. 3, after the word line driver 42a is selected through the decoding signals XPA, XPB, XPC corresponding to the logic value "0", an output port of the NOR gate 48a corresponding to the logic value "1" if the decoding signal $XT_0$ corresponds to the logic value "1". With regard to other decoding signal such as the decoding signal $XT_1$, the output port of the NOR gate 48b corresponds to the logic value "0" because the logic value associated with the decoding signal $XT_1$ is "0".

Please note that a level shift circuit is interposed between an output port of each NOR gate and a corresponding word line $WL_0$–$WL_7$. As shown in FIG. 3, the NOR gate 48a is electrically connected to the level shift circuit 50a, the NOR gate 48b is electrically connected to the level shift circuit 50b, and the NOR gate 48c is electrically connected to the level shift circuit 50c. The level shift circuits 50a, 50b, 50c apply the same circuit structure. Taking the level shift circuit 50a for example, the level shift circuit 50a has transistors 52a, 52b, 52c, 52d and an inverter 54, wherein the transistors 52a, 52c are PMOS transistors, and the transistors 52b, 52d are NMOS transistors. Suppose that the flash memory 10 runs the reading operation. Therefore, the power supply circuit 38 respectively outputs +3.3V and 0V. The voltage level +3.3V is used to be the voltage level V1 shown in FIG. 3, and the voltage level 0V is used to be the voltage level V2 shown in FIG. 3. When an output port of the NOR gate 48a corresponds to the logic value "1", the transistor 52b is turned on for driving a node A to approach 0V. That is, the node A corresponds to the logic value "0".

At the same time, the transistor 52c is turned on to make a node B approach a voltage level equaling 0V. That is, the node B corresponds to the logic value "1". Because the transistors 52a, 52d are not turned on, the word line $WL_0$ finally approaches a voltage level equaling +3.3V for successfully reading data stored by the memory cell. On the contrary, when the output port of the NOR gate 48a corresponds to the logic value "0", the transistor 52b is turned off without conducting current, but an output port of the inverter 54 corresponds to the logic value "1" to turn on the transistor 52d. Therefore, a node B approaches a voltage level equaling 0V. That is, the node B corresponds to the logic value "0". At the same time, the transistor 52a is turned on to make the node A approach a voltage level equaling +3.3V. That is, the node A corresponds to the logic value "1". Because the transistors 52b, 52c are not turned on, the word line $WL_0$ finally approaches a voltage level equaling 0V so that the corresponding memory cell can not be read with such a low voltage.

As mentioned above, each of the word lines $WL_0$–$WL_7$ needs to be connected to a corresponding level shift circuit. Taking the level shift circuit 50a for example, the level shift circuit 50a determines the word line $WL_0$ being driven to approach the voltage level V1 or the voltage level V2 according to the decoding signals XPA, XPB, XPC, $XT_0$. It is obvious that the level shift circuit 50a requires at least 6 transistors to enable its logic function. Therefore, when the prior art flash memory 10 has a plurality of word lines, the amount of transistors used in the row driver 36 is huge, making the chip size of the flash memory 10 accordingly large.

SUMMARY OF INVENTION

It is therefore a primary objective of this invention to provide a flash memory providing a plurality of word line drivers with an identical driving voltage output circuit for greatly reducing a total amount of implemented transistors.

Briefly summarized, the preferred embodiment of the present invention discloses a non-volatile memory having a plurality of memory blocks, a first decoder for decoding a memory address to generate a plurality of first decoding signals, a second decoder for decoding the memory address to generate a plurality of second decoding signals, and a row driver for driving a predetermined word line to approach a predetermined voltage level. Each of the memory blocks comprises a plurality of word lines, and each of the word lines is electrically connected to a plurality of memory cells. The row driver includes a plurality of word line drivers electrically connected to the first decoder and the second decoder. Each of the word line drivers has a plurality of driving units wherein each of the driving units is electrically connected to a word line, a memory block selector electrically connected to the driving units for turning on the driving units according to the first decoding signals, and a driving voltage output circuit electrically connected to the driving units for determining a plurality of driving voltages according to the second decoding signals without using the first decoding signals, and outputting a predetermined driving voltage to drive the predetermined word line to approach the predetermined voltage level when a driving unit connected to the predetermined word line is turned on to electrically connect the predetermined word line and the driving voltage output circuit.

It is an advantage of the present invention that one driving voltage output circuit is used to drive a plurality of word line drivers so that the amount of transistors implemented in the claimed flash memory is greatly reduced. Therefore, the claimed flash memory has a smaller chip size and a lower production cost.

These and other objectives of the present invention will no doubt become obvious to those of ordinary skill in the art after reading the following detailed description of the preferred embodiment, which is illustrated in the various figures and drawings.

DETAILED DESCRIPTION

Figure 4:
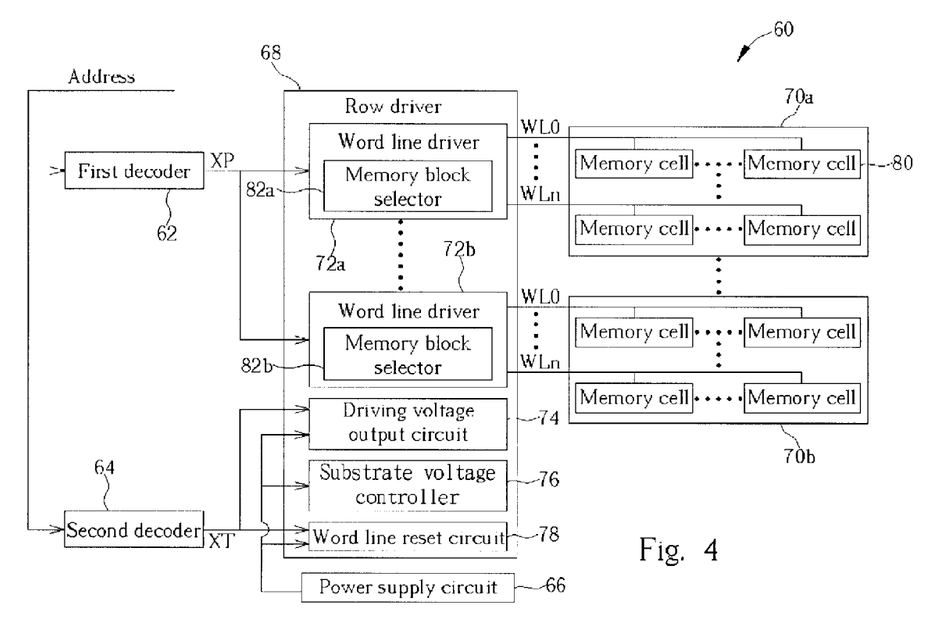
FIG. 4 is a block diagram of a flash memory according to the present invention.

Please refer to FIG. 4, which is a block diagram of a flash memory according to the present invention. The flash memory 60 has a first decoder 62, a second decoder 64, a power supply circuit 66, a row driver 68, and a plurality of memory blocks 70a, 70b. The row driver 68 has a plurality of word line drivers 72a, 72b, a driving voltage output circuit 74, a substrate voltage controller 76, and a word line reset circuit 78. The word line drivers 72a, 72b respectively correspond to the memory blocks 70a, 70b. Each of the memory blocks 70a, 70b has a plurality of memory cells 80. In addition, memory block selectors 82a, 82b are respectively positioned in the word line drivers 72a, 72b for determining if the word line drivers 72a, 72b are activated. Each of the word line drivers 72a, 72b is used to control voltage levels assigned to a plurality of word lines $WL_0$–$WL_n$. As shown in FIG. 4, Each of the word lines $WL_0$–$WL_n$ is electrically connected to a plurality of memory cells 80. The first decoder 62 is used to decode a memory address ADDRESS for generating a first decoding signal XP. The first decoding signal XP is used to determine which word line driver 72a, 72b is selected. For example, the memory address ADDRESS corresponds to one memory cell 80 located at the memory block 70a. After the first decoder 62 decodes the memory address ADDRESS, the first decoder 62 acknowledges that the word line driver 72a needs to be activated for accessing the memory block 70a owing to the relationship between the memory address ADDRESS and the memory block 70a, and the first decoding signal XP is then issued by the first decoder 62 to select the wanted word line driver 72a.

In addition, the second decoder 34 also decodes the memory address ADDRESS for generating a second decoding signal XT to the driving voltage output circuit 74. The second decoding signal XT is used to determine which word line needs to be driven by a specific operating voltage for programming, reading, or erasing a predetermined memory cell. Then, the driving voltage output circuit 74 controls voltage levels of the word lines $WL_0$–$WL_n$ within one word line driver selected by the first decoding signal XP according to the information provided by the second decoding signal XT and the operating voltages provided by the power supply circuit 66. For instance, the memory address ADDRESS corresponds to a memory cell 80 located at the word line $WL_0$ within the memory block 70a. If the flash memory 60 starts a reading operation, the control gate of the memory cell, as mentioned above, needs to be driven by a voltage equaling +3.3V. Therefore, the power supply circuit 66 outputs an operating voltage equaling +3.3V to the driving voltage output circuit 74. When the first decoding signal XP selects the word line driver 72a, and the second decoding signal XT selects the word line $WL_0$, the driving voltage output circuit 74 is capable of delivering the operating voltage equaling +3.3V to the word line $WL_0$ for reading the memory cells 80 located at the word line $WL_0$ successfully.

With regard to other unselected word lines $WL_1$–$WL_n$, the driving voltage output circuit 74 is unable to output the operating voltage equaling +3.3V to the word lines $WL_1$–$WL_n$. Therefore, data stored by the memory cells 80 located at the word lines $WL_1$–$WL_n$ can be successfully read. Furthermore, the substrate voltage controller 76 electrically connected to the power supply circuit 66 us used for providing the substrates of transistors in the word line drivers 72a, 72b with appropriate voltages when the flash memory 60 runs the programming operation, the reading operation, or the erasing operation. When the flash memory 60 runs the programming operation, the reading operation, or the erasing operation, the word line reset circuit 78 is used to control whether the voltage levels of the word lines $WL_0$–$WL_n$ are reset to approach a predetermined voltage level such as the grounding voltage.

As mentioned above, the power supply circuit 66 is used to provide the row driver 68 with required operating voltages. For example, when the flash memory 60 performs the programming operation, the power supply circuit 66 outputs a voltage equaling +8.5V to the driving voltage output circuit 74 so that the driving voltage output circuit 74 can further drive the control gate of the memory cell 80 to approach the voltage level equaling +8.5V if the memory cell 80 needs to be programmed. On the contrary, if the memory cell 80 does not need to be programmed, the power supply circuit 66 outputs a voltage equaling 0V to the driving voltage output circuit 74 so that the driving voltage output circuit 74 then drives the control gate of the memory cell 80 to approach the voltage level equaling 0V. When the flash memory 60 performs the reading operation, the power supply circuit 66 outputs a voltage equaling +3.3V to the driving voltage output circuit 74 so that the driving voltage output circuit 74 can further drive the control gate of the memory cell 80 to approach the voltage level equaling +3.3V if the memory cell 80 needs to be read.

On the contrary, if the memory cell 80 does not need to be read, the power supply circuit 66 outputs a voltage equaling 0V to the driving voltage output circuit 74 so that the driving voltage output circuit 74 then drives the control gate of the memory cell 80 to approach the voltage level equaling 0V. Similarly, the power supply circuit 38 provides the row driver 68 with needed voltage levels such 7.5V and 0V when the flash memory 60 runs the erasing operation. With regard to the memory cells 80 whose stored data need to be erased, the control gates of the memory cells 80 are driven to approach 7.5V. With regard to the memory cell 80 whose stored data do not need to be erased, the control gates of the memory cells 80 are driven to approach 0V. In other words, the power supply circuit 66 provides the row driver 68 with different operating voltages according to the programming operation, the reading operation, or the erasing operation currently run by the flash memory 10.

Figure 5:
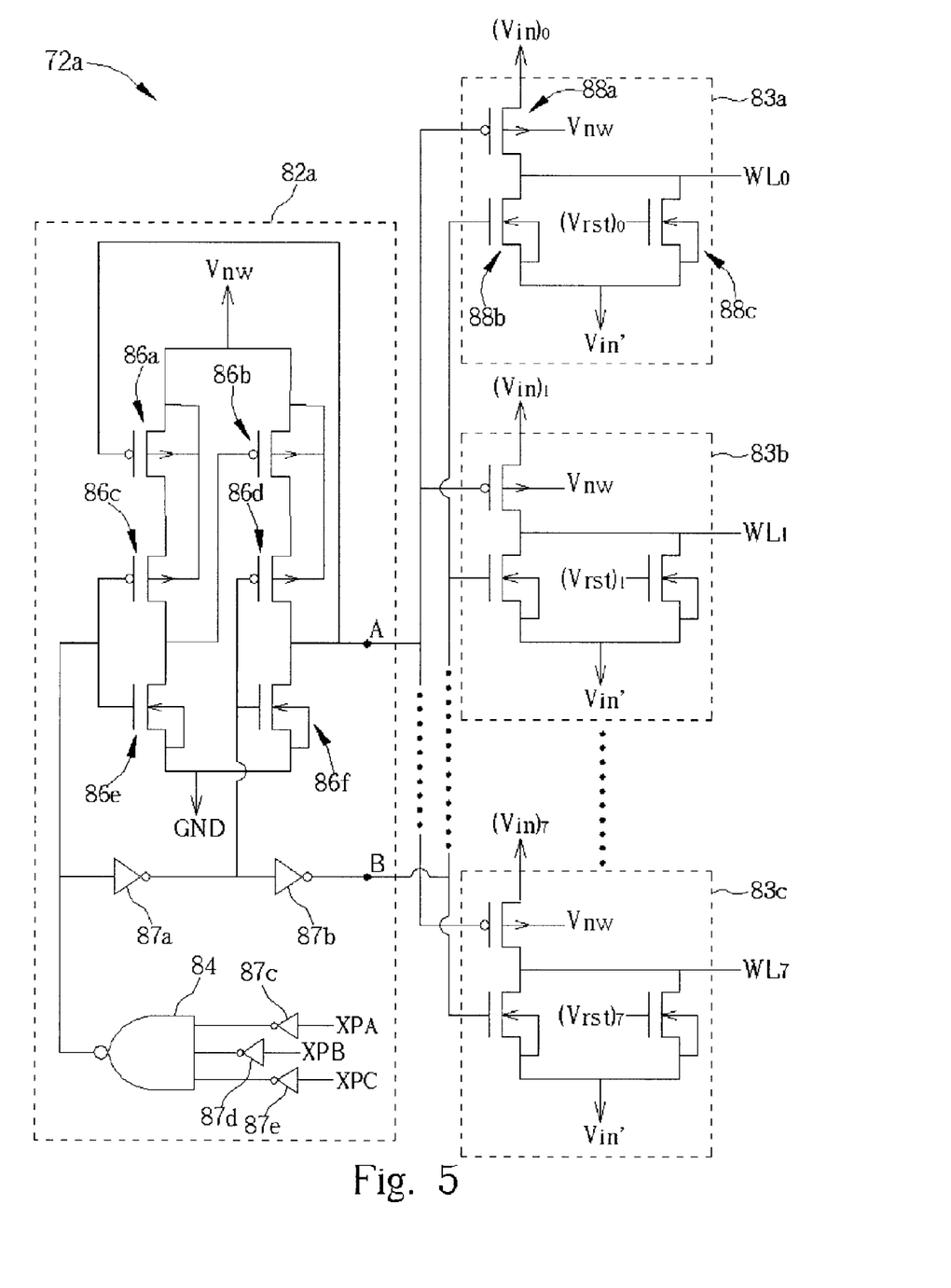
FIG. 5 is a circuit diagram of a word line driver shown in FIG. 4.

Please refer to FIG. 5, which is a circuit diagram of the word line driver 72a shown in FIG. 4. The word line driver 72a has a memory block selector 82a and a plurality of driving units 83a, 83b, 83c. The memory block selector 82a has an NAND gate 84, a plurality of transistors 86a, 86b, 86c, 86d, 86e, 86f, and a plurality of inverters 87a, 87b, 87c, 87d, 87e. Each of the driving units 83a, 83b, 83c individually corresponds to a word line. For instance, the word line driver 72a is used to control 8 word lines $WL_0$–$WL_7$, wherein the driving unit 83a is used to drive the word line $WL_0$, the driving unit 83b is used to drive the word line $WL_1$, and the word line $WL_7$ is used to drive the word line $WL_7$. Each of the driving units 83a, 83b, 83c has the same circuit structure. Taking the driving unit 83a for example, the driving unit 83a has a plurality of transistors 88a, 88b, 88c. The transistors 88b, 88c are NMOS transistors, but the transistor 88a is a PMOS transistor. The transistor 88a is fabricated on an n-type substrate such as an N well, and the n-type substrate is electrically connected to a voltage Vnw. Please note that a voltage level associated with the voltage Vnw is dominated by the substrate voltage controller 76, but the voltages $(Vin)_0$–$(Vin)_7$ inputted into the driving units 83a, 83b, 83c are dominated by the driving voltage output circuit 74. In addition, the voltage Vin inputted into each of the driving units 83a, 83b, 83c is provided by the power supply circuit 66. In the row driver 68, the circuit structure of each word line driver is identical. Therefore, only one word line driver 72a is illustrated for simplicity.

As described above, the first decoding signal XP generated from the first decoder 62 is used to choose one word line driver in the row driver 68. Suppose that the row driver 68 has 8 word line drivers. The word line driver 72a is the first word line driver, and the word line driver 72b is the last word line driver. It is well-known that three decoding signals XPA, XPB, XPC can successfully select any wanted word line driver out of the 8 word line drivers within the row driver 68. For example, the decoding signal XPA can be driven by either the logic value "1" or the logic value "0", the decoding signal XPB can be driven by either the logic value "1" or the logic value "0", and the decoding signal XPC can be driven by either the logic value "1" or the logic value "0". Therefore, with help of the different logic values assigned to the decoding signals XPA, XPB, XPC, the decoding signals XPA, XPB, XPC can generate $2^3$ different combinations. In other words, when the first decoding signal XP is consisted of three decoding signals XPA, XPB, XPC, one combination established by the decoding signals XPA, XPB, XPC is used to choose a specific word line driver.

As shown in FIG. 5, the decoding signals XPA, XPB, XPC are processed by inverters 87c, 87d, 87e to become corresponding inverted signals, and the inverted signals are inputted into the NAND gate 84. Therefore, the output port of the NAND gate 84 corresponds to the logic value "1" if each of the decoding signals XPA, XPB, XPC corresponds to the logic value "0". In other words, the word line driver 72a is selected under this condition only. For each word line driver, the circuit structure is similar to that of the word line driver 72a. The only difference is that the signals inputted into the NAND gate 84. Taking the word line driver 72b for example, the signals inputted into the NAND gate 84 are decoding signals XPA, XPB, XPC directly without being processed by inverters. Therefore, the output port of the NAND gate 84 corresponds to the logic value "1" if each of the decoding signals XPA, XPB, XPC corresponds to the logic value "1". In other words, the word line driver 72b is selected under this condition. To sum up, the logic values of the decoding signals XPA, XPB, XPC can be used to determine which word line driver is picked through the control of the NAND gate 84.

In the preferred embodiment, when the decoding signals XPA, XPB, XPC correspond to the same logic value "0", the NAND gate 84 of the word line driver 72a outputs the logic value "0". After the logic value "0"processed by the inverters 87a, 87b, the node B corresponds to the logic value "0". That is, the voltage level at the node B is a low voltage such as a grounding voltage. With regard to the node A, the node A corresponds to the logic value "0" as well because the transistors 86a, 86c, 86f are turned on, and the transistors 86b, 86d, 86e stay off. That is, the voltage level at the node A also corresponds to the grounding voltage. The transistor 88a is then turned on so that the voltages $(Vin)_0$–$(Vin)_7$ can drive corresponding word lines $WL_0$–$WL_7$ successfully. On the contrary, when all of the three decoding signals XPA, XPB, XPC do not correspond to the same logic value "0", the NAND gate 84 outputs the logic value "1". After the logic value "1" is processed by the inverters 87a, 87b, the node B corresponds to the logic value "1". That is, the voltage level at the node B is a positive voltage higher than the grounding voltage GND. With regard to the node A, the node A corresponds to the logic value "1" as well because the transistors 86b, 86d, 86e are turned on, and the transistors 86a, 86c, 86f stay off. That is, the voltage level at the node A corresponds to the voltage Vnw (a substrate voltage of the transistor 88a) so that the transistor 88a can be turned on. Because the transistor 88b is turned on, the voltage Vin" instead drives all of the word lines $WL_0$–$WL_7$.

Figure 6:
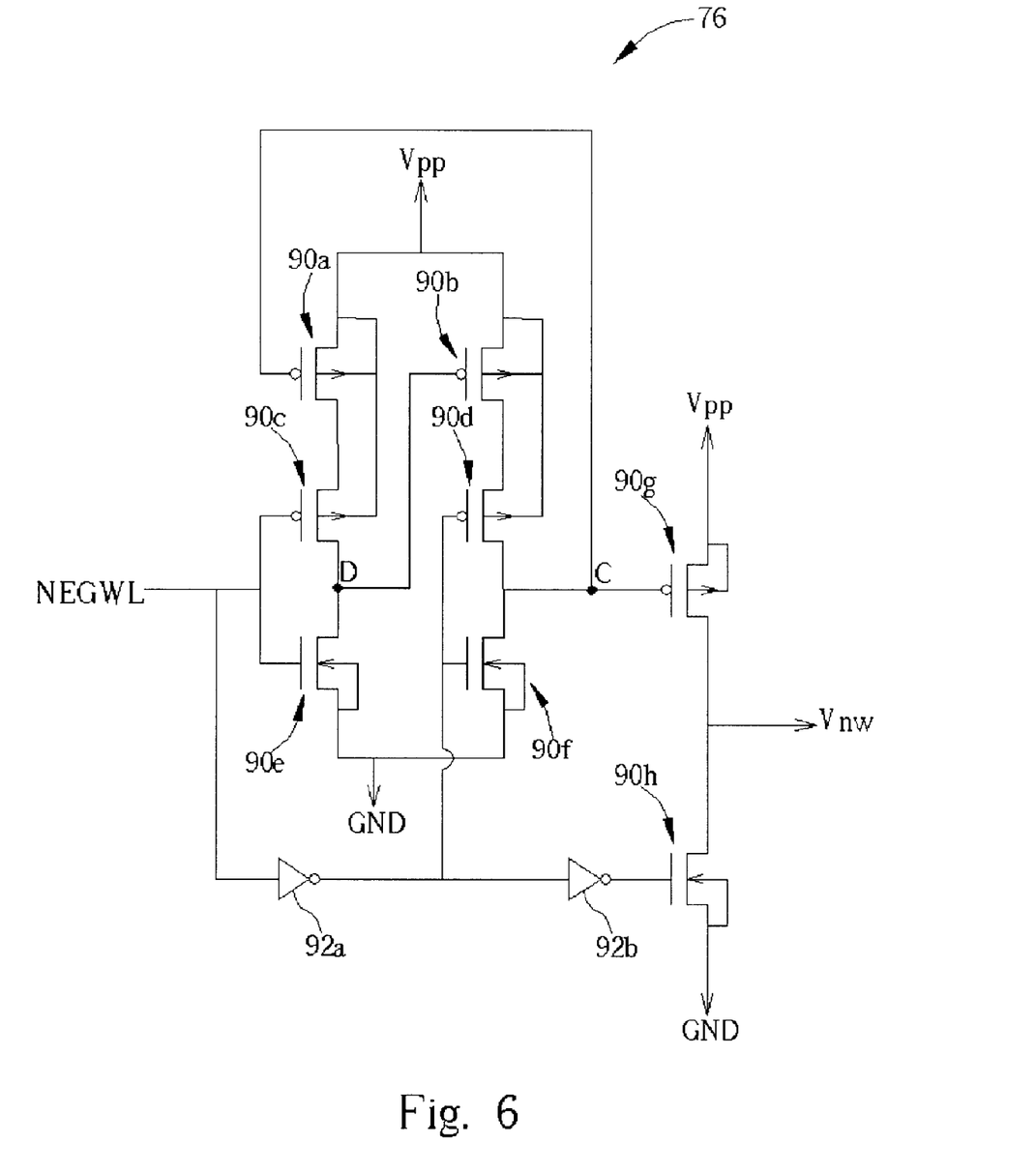
FIG. 6 is a circuit diagram of a substrate voltage controller shown in FIG. 4.

Please refer to FIG. 6, which is a circuit diagram of the substrate voltage controller 76 shown in FIG. 4. The substrate voltage controller 76 has a plurality of transistors 90a, 90b, 90c, 90d, 90e, 90f, 90g, 90h, and two inverters 92a, 92b. If the flash memory 60 performs the programming operation or the reading operation, an input signal NEGWL corresponds to the logic value "0". That is, the input signal NEGWL is the grounding voltage. The transistor 90e remains off, but the transistor 90c is turned on. In addition, the output port of the inverter 92a corresponds to the logic value "1". That is, the output port of the inverter 92a is driven by a high voltage level such as a voltage Vpp. The transistor 90f is turned on, but the transistor 90d remains off. A node C is electrically connected to the grounding terminal GND to be driven by the grounding voltage because the transistor 90f is turned on. The transistor 90a is accordingly turned on to make a voltage level at a node D approach the voltage Vpp. The transistor 90b stays off after the voltage level of the node D approaches the voltage Vpp. It is obvious that an output port of the inverter 92b corresponds to the grounding voltage. Therefore, the transistor 90h can be turned on.

However, the transistor 90g is turned on to make the voltage Vnw equal the supplied voltage Vpp. In other words, if the flash memory 60 performs the programming operation or the reading operation, the voltage Vnw is set by the substrate voltage controller 76 to equal the voltage Vpp such as +8.5V. On the contrary, if the flash memory 60 runs the erasing operation, the input signal NEGWL corresponds to the logic value "1". That is, the input signal NEGWL is driven to hold a high voltage level such as the voltage Vpp. Therefore, the transistor 90c stays off, and the transistor 90e is turned on to make the node D electrically connected to the grounding terminal GND. In addition, the output port of the inverter 92a corresponds to the logic value "0". That is, a voltage level of the output port of the inverter 92a become the grounding voltage, and the transistor 90d is turned on to make the voltage level at the node C approach the voltage Vpp. At the same time, the transistor 90a stays off. It is obvious that the output port of the inverter 92b corresponds to the high voltage level such as the voltage Vpp. Therefore, the transistor 90g is not turned on, and the transistor 90h is turned on in the end to drive the voltage Vnw toward the grounding voltage. In other words, if the flash memory 60 runs the erasing operation, the voltage Vnw is set by the substrate voltage controller 76 to be the grounding voltage such as 0V.

Figure 7:
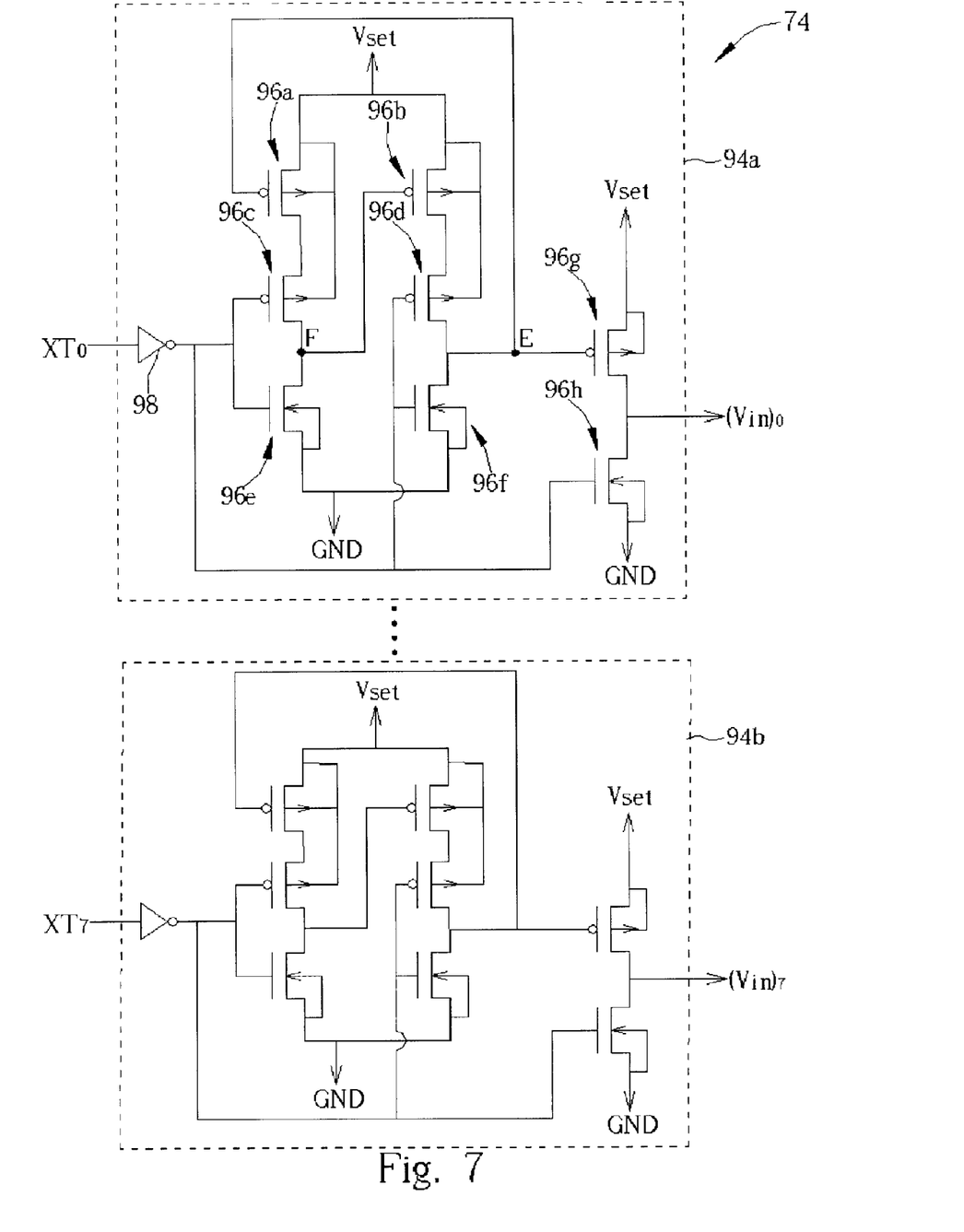
FIG. 7 is a circuit diagram of a driving voltage output circuit shown in FIG. 4.

Please refer to FIG. 7, which is a circuit diagram of the driving voltage output circuit 74 shown in FIG. 4. The driving voltage output circuit 74 has a plurality of output units 94a, 94b. As shown in FIG. 5, if the word line driver 82 is used to drive voltage levels of 8 word lines $WL_0$–$WL_7$, the driving voltage output circuit 74 needs to include 8 output units 94a, 94b for setting the voltages $(Vin)_0$–$(Vin)_7$ required by each of the driving units 83a, 83b, 83c. In FIG. 7, the output unit 94a is used to set the voltage $(Vin)_0$, and the output unit 94b is used to set the voltage $(Vin)_7$. Each of the output units 94a, 94b has the same circuit structure. Taking the output unit 94a for example, the output unit 94a has a plurality of transistors 96a, 96b, 96c, 96d, 96e, 96f, 96g, 96h and an inverter 98. If the flash memory 60 performs the programming operation, the voltage Vset provided by the power supply circuit 66 corresponds to the above-mentioned voltage Vpp such as +8.5V. When the memory cells 80 at the word line $WL_0$ needs to be programmed, the second decoding signal XT outputted from the second decoder 64 is used to select the word line $WL_0$. That is, if the second decoding signal XT consists of decoding signals $XT_0$–$XT_7$, the decoding signal $XT_0$ corresponds to the logic value "1", and other decoding signals $XT_1$–$XT_7$ correspond the logic value "0".

For the output unit 94a, an output port of the inverter 98 corresponds to the logic value "0". That is, a voltage level at the output port of the inverter 98 is the grounding voltage. The transistor 96e remains off, but the transistor 96c is turned on. In addition, because the decoding signal $XT_0$ corresponds to a high voltage level such as a voltage Vset, the transistor 96f is turned on, and the transistor 96d remains off. With the transistor 96f being switched on, a node E is electrically connected to the grounding terminal GND to be driven by the grounding voltage. Therefore, the transistor 96a is turned on to make a voltage level at a node F approach the voltage Vset so that the transistor 96b stays off. It is obvious that the transistor 90h remains off, and the transistor 90g is turned on to drive the voltage $(Vin)_0$ toward the voltage Vset. On the contrary, for the unselected decoding signals $XT_1$–$XT_7$, the decoding signals $XT_1$–$XT_7$ correspond to the logic value "0". That is, voltage levels of the decoding signals $XT_1$–$XT_7$ are the grounding voltage. Therefore, the output port of the inverter 98 corresponds to the logic value "1" to hold the high voltage level such as the voltage Vset. The transistor 96c remains off, but the transistor 96e is turned on to make the node F electrically connected to the grounding terminal GND. In addition, the transistor 96d is turned on, and the transistor 96f remains off. With the transistor 96e being switched on, the transistor 96e drives the voltage level at the node F to approach the grounding voltage. The transistor 96b is accordingly turned on to make the voltage level at the node E approach the voltage Vset. At the same time, the transistor 96a stays off.

It is obvious that the transistor 96g remains off, but the transistor 96h is turned on to drive the voltage $(Vin)_0$ to approach the grounding voltage. If the flash memory 60 runs the reading operation, the voltage Vset provided by the power supply circuit 66 corresponds to a voltage Vdd such as +3V. However, if the flash memory 60 runs the erasing operation, the voltage Vset provided by the power supply circuit 66 corresponds to the grounding voltage such as 0V. Please note that the operation of the driving voltage output circuit 74 has been described above, and it is not repeated for the reading operation and the erasing operation. To sum up, the driving voltage output circuit 74 controls the voltages $(Vin)_0$–$(Vin)_7$ according to the voltage Vset provided by the power supply circuit 66 and the decoding signals $XT_0$–$XT_7$.

Please refer to FIG. 4–FIG. 7 at the same time. The detailed operation associated with the word line driver 72a is described as follows.

(1) The Reading Operation

At this time, the voltage Vin" generated from the power supply circuit 66 corresponds to the grounding voltage (0V). For the memory cells 80 prepared to read stored data, the driving voltage output circuit 74 drives voltages $(Vin)_0$–$(Vin)_7$ toward +3V. On the contrary, with regard to the memory cells 80 without being read, the driving voltage output circuit 74 drives corresponding voltages $(Vin)_0$–$(Vin)_7$ toward the grounding voltage. As shown in FIG. 7, the voltage Vset equals +3V. In addition, because the reading operation is performed, the voltage Vpp shown in FIG. 6 equals +8.5V. That is, the substrate voltage controller 76 controls the voltage Vnw to approach +8.5V.

If the memory cells 80 being read are located at the word line $WL_0$ of the memory block 70a, the first decoding signal XP outputted from the first decoder 62 enables the word line driver 72a. That is, the memory block selector 82a sets the nodes A, B to correspond to the logic value "0" according to the decoding signals XPA, XPB, XPC. Therefore, the transistor 88a of each driving unit 83a, 83b, 83c is turned on, and the transistor 88b of each driving unit 83a, 83b, 83c remains off. Because the memory cells 80 being read are positioned at the word line $WL_0$, the decoding signal $XT_0$ within the second decoding signal XT outputted from the second decoder 64 corresponds to the logic value "1". However, remaining decoding signals $XT_1$–$XT_7$ correspond to the logic value "0". As shown in FIG. 7, the voltage $(Vin)_0$ is driven by the voltage Vset (+3V), but the voltages $(Vin)_1$–$(Vin)_7$ correspond to the grounding voltage. As shown in FIG. 5, the voltage level of the word line $WL_0$ is driven to approach the voltage $(Vin)_0$. The word line $WL_0$, therefore, is capable of holding a voltage level equaling +3V, and the data stored in the memory cells 80 located at the word line $WL_0$ of the memory block 70a are successfully retrieved. With regard to remaining word lines $WL_1$–$WL_7$, the corresponding voltage levels of the word lines $WL_1$–$WL_7$ are driven by voltages $(Vin)_1$–$(Vin)_7$. In other words, the word lines $WL_1$–$WL_7$ hold the grounding voltage (0V) so that the data stored in the memory cells 80 located at the word line $WL_1$–$WL_7$ of the memory block 70a can not be retrieved.

If the memory cells 80 being read are located at the word line $WL_0$ of the memory block 70b, the first decoding signal XP outputted from the first decoder 62 enables the word line driver 72b. Therefore, for the unselected word line driver 72a, the memory block selector 82a sets the nodes A, B to correspond to the logic value "1" according to the decoding signals XPA, XPB, XPC associated with the selected word line driver 72b. The transistor 88a of each driving unit 83a, 83b, 83c remains off, but the transistor 88b of each driving unit 83a, 83b, 83c is turned on. Because the data stored in the memory cells 80 of the memory block 72a do not need to be read, the voltage Vin" drives each of the word lines $WL_0$–$WL_7$ after the transistors 88b of the driving unit 83a, 83b, 83c are turned on. Please note that the voltage Vin" is the grounding voltage when the reading operation is performed. In other words, the data stored in the memory cells 80 located at the word lines $WL_0$–$WL_7$ can not be read owing to the grounding voltage held by the word lines $WL_0$–$WL_7$.

(2) The Programming Operation

At this time, the voltage Vin" generated from the power supply circuit 66 corresponds to the grounding voltage (0V). For the memory cells 80 prepared to be programmed, the driving voltage output circuit 74 drives voltages $(Vin)_0$–$(Vin)_7$ toward +8.5V. On the contrary, with regard to the memory cells 80 without being programmed, the driving voltage output circuit 74 drives corresponding voltages $(Vin)_0$–$(Vin)_7$ toward the grounding voltage. As shown in FIG. 7, the voltage Vset equals +8.5V. In addition, because the programming operation is performed, the voltage Vpp shown in FIG. 6 equals +8.5V. That is, the substrate voltage controller 76 controls the voltage Vnw to approach +8.5V.

If the memory cells 80 being programmed are located at the word line $WL_0$ of the memory block 70a, the first decoding signal XP outputted from the first decoder 62 enables the word line driver 72a. That is, the memory block selector 82a sets the nodes A, B to correspond to the logic value "0" according to the decoding signals XPA, XPB, XPC. Therefore, the transistor 88a of each driving unit 83a, 83b, 83c is turned on, and the transistor 88b of each driving unit 83a, 83b, 83c remains off. Because the memory cells 80 being programmed are positioned at the word line $WL_0$, the decoding signal $XT_0$ within the second decoding signal XT outputted from the second decoder 64 corresponds to the logic value "1". However, remaining decoding signals $XT_1$–$XT_7$ correspond to the logic value "0". As shown in FIG. 7, the voltage $(Vin)_0$ is driven by the voltage Vset (+8.5V), but other voltages $(Vin)_1$–$(Vin)_7$ correspond to the grounding voltage. As shown in FIG. 5, the voltage level of the word line $WL_0$ is driven to approach the voltage $(Vin)_0$. The word line $WL_0$, therefore, is capable of holding a voltage level equaling +8.5V, and the data stored in the memory cells 80 located at the word line $WL_0$ of the memory block 70a are successfully programmed. With regard to remaining word lines $WL_1$–$WL_7$, the corresponding voltage levels of the word lines $WL_1$–$WL_7$ are driven by voltages $(Vin)_1$–$(Vin)_7$. In other words, the word lines $WL_1$–$WL_7$ hold the grounding voltage (0V) so that the data stored in the memory cells 80 located at the word line $WL_1$–$WL_7$ of the memory block 70a can not be programmed.

If the memory cells 80 being programmed are located at the word line $WL_0$ of the memory block 70b, the first decoding signal XP outputted from the first decoder 62 enables the word line driver 72b. Therefore, for the unselected word line driver 72a, the memory block selector 82a sets the nodes A, B to correspond to the logic value "1"

according to the decoding signals XPA, XPB, XPC associated with the selected word line driver 72b. The transistor 88a of each driving unit 83a, 83b, 83c remains off, but the transistor 88b of each driving unit 83a, 83b, 83c is turned on. Because the memory cells 80 of the memory block 72a do not need to be programmed, the voltage Vin" drives each of the word lines $WL_0$–$WL_7$ after the transistors 88b of the driving unit 83a, 83b, 83c are turned on. Please note that the voltage Vin" is the grounding voltage when the programming operation is performed. In other words, the memory cells 80 located at the word lines $WL_0$–$WL_7$ can not be programmed owing to the grounding voltage held by the word lines $WL_0$–$WL_7$.

(2) The Erasing Operation

At this time, the voltage Vin" generated from the power supply circuit 66 corresponds to a negative voltage (−7V for example). For the memory cells 80 prepared to be erased, the driving voltage output circuit 74 drives voltages $(Vin)_0$–$(Vin)_7$ toward the grounding voltage (0V). As shown in FIG. 7, the voltage Vset equals 0V. In addition, because the erasing operation is performed, the input signal NEGWL shown in FIG. 6 corresponds to the logic value "1". Therefore, the grounding voltage drives the voltage Vnw to approach 0V. That is, the substrate voltage controller 76 controls the voltage Vnw to approach 0V.

Suppose that the data stored in all memory cells 80 of the flash memory 60 need to be erased, and that the first decoding signal XP outputted from the first decoder 62 enables the word line driver 72a. That is, the memory block selector 82a sets the nodes A, B to correspond to the logic value "0" according to the decoding signals XPA, XPB, XPC. Please note that the substrate of the transistor 88a in each driving unit 83a, 83b, 83c is electrically connected to the grounding voltage now, and the source of the transistor 88b in each driving unit 83a, 83b, 83c is electrically connected to the negative voltage. Therefore, when the grounding voltage is inputted into the gates of the transistors 88a, 88b in each driving unit 83a, 83b, 83c, the transistor 88a in each driving unit 83a, 83b, 83c remains off, and the transistor 88b in each driving unit 83a, 83b, 83c is turned on. The voltage Vin" drives the voltages $(Vin)_0$–$(Vin)_7$ to approach 7V through the enabled transistor 88b in each driving unit 83a, 83b, 83c. In other words, the data stored in all memory cells 80 of the memory block 70a can be erased successfully.

In addition, suppose the first decoding signal XP outputted from the first decoder 62 enables the word line driver 72b. Therefore, for the unselected word line driver 72a, the voltage level at the node A corresponds to the voltage Vnw to approach 0V. Therefore, the transistor 88a of each driving unit 83a, 83b, 83c remains off. However, the voltage level at the node B is high enough to turn on the transistor 88b of each driving unit 83a, 83b, 83c. The voltage Vin" then drives the voltages $(Vin)_0$–$(Vin)_7$ to approach 7V. In other words, when the flash memory 60 runs the erasing operation, the word lines $WL_0$–$WL_7$ associated with the corresponding word line drivers 72a, 72b in row driver 68 are driven by the voltage Vin" to have the voltage level equaling 7V. So, the data stored in all memory cells 80 of the flash memory 60 can not be erased successfully.

Please note that the grounding voltage is inputted into the transistors 88a, 88b when the erasing operation is performed. If the transistor 88b is turned on, the drain of the transistor 88a is driven by the voltage Vin" to have the voltage level approaching 7V. However, the source of the transistor 88a is still controlled by the driving voltage output circuit 74 to have the voltage level approaching the grounding voltage. Suppose that the voltage Vnw is kept at the voltage level used for the reading operation or the programming operation, that is, +8.5V. A great inverse bias (15.5V) is induced between the drain of the transistor 88a and the substrate of the transistor 88a. Therefore, it is possible that the drain of the transistor 88a and the substrate of the transistor 88a is electrically connected owing to a junction breakdown, and the erasing operation fails. The preferred embodiment discloses a substrate voltage controller 74 that is capable of driving the voltage Vnw inputted into the substrate of the transistor 88a to approach the grounding voltage when the flash memory 60 starts the erasing operation. The above-mentioned excess inverse bias is prevented from occurring.

When a predetermined word line driver (the word line driver 72a for example) is activated for the reading operation or the programming operation, the transistor 88a in each driving unit 83a, 83b, 83c is turned on. Therefore, the voltages $(Vin)_0$–$(Vin)_7$ are capable of driving corresponding word lines $WL_0$–$WL_7$. In other words, the voltage levels of the voltages $(Vin)_0$–$(Vin)_7$ determine whether the memory cells 80 at word lines $WL_0$–$WL_7$ are required to be programmed or read. For example, suppose that the memory cells 80 at the word line $WL_0$ need to be programmed or read. The voltage $(Vin)_0$ outputted from the driving voltage output circuit 74 corresponds to a positive voltage such as +8.5V or +3V. Therefore, the voltage level +8.5V for the programming operation or the voltage level +3V is delivered to the word line $WL_0$ through the transistor 88a. On the contrary, if the memory cells 80 at the word line $WL_0$ does not need to be programmed or read, the voltage $(Vin)_0$ provided by the driving voltage output circuit 74 corresponds to the grounding voltage such as 0V. Therefore, the voltage level 0V for the programming operation or the reading operation is delivered to the word line $WL_0$. However, the transistor 88a is a PMOS transistor, and a threshold voltage of the transistor 88a corresponds to a negative voltage Vtp. For the driving unit 83a, the transistor 88a is turned on when the gate of the transistor 88a is driven by the grounding voltage. If the voltage $(Vin)_0$ inputted into the source of the transistor 88a corresponds to a positive voltage, the voltage level of the word line $WL_0$ becomes the voltage $(Vin)_0$.

However, suppose that the voltage $(Vin)_0$ inputted into the drain of the transistor 88a corresponds to the grounding voltage. When the voltage level of the word line $WL_0$ is lower than a positive voltage Vtp, a voltage difference between between the gate of the transistor 88a and the source of the transistor 88a is lower than the positive voltage Vtp so that the transistor 88a can not conduct current. That is, the voltage level of the word line $WL_0$ is deviated from the predetermined grounding voltage to approach the positive voltage Vtp finally. In other words, the PMOS transistor has better transmission performance for transferring the logic value "1". On the contrary, it is well-known that the NMOS transistor has better transmission performance for transferring the logic value "0". In order to solve the problem associated with the transistor 88a delivering the grounding voltage to the word lines $WL_0$–$WL_7$, the preferred embodiment utilizes a transistor 88c in each of the driving units 83a, 83b, 83c to help the transistor 88a deliver the wanted grounding voltage to the word lines $WL_0$–$WL_7$. Then, the flash memory 60 functions correctly. In addition, the voltages $(Vrst)_0$–$(Vrst)_7$ generated from the word line reset circuit 78 shown in FIG. 4 determine whether the transistor 88c in each driving unit 83a, 83b, 83c is activated or not.

Figure 8:
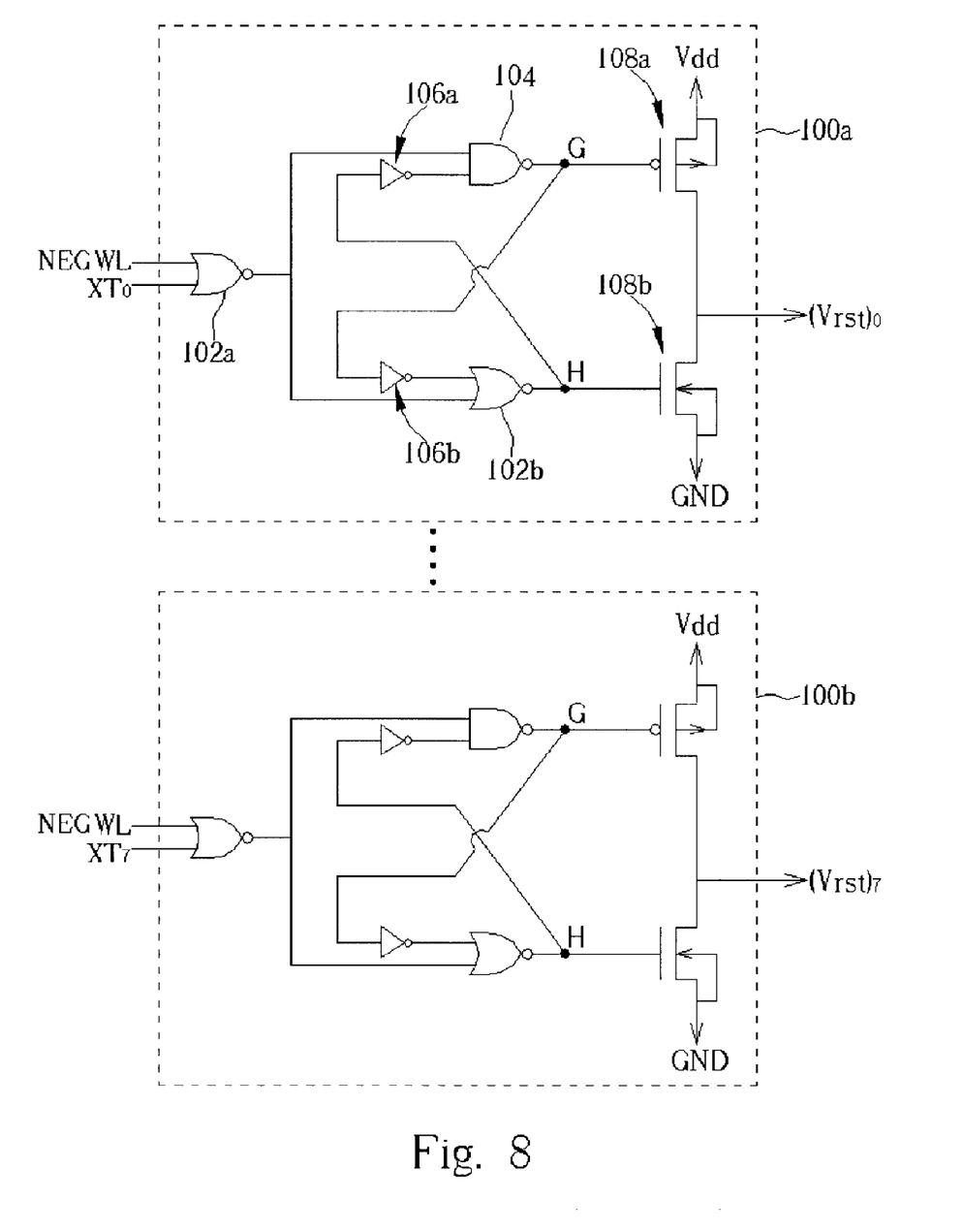
FIG. 8 is a circuit diagram of a word line reset circuit shown in FIG. 4.

Please refer to FIG. 8, which is a circuit diagram of the word line reset circuit 78 shown in FIG. 4. The word line reset circuit 78 has a plurality of voltage level reset units 100a, 100b. Please note that only two voltage level reset units 100a, 100b are shown in FIG. 8 for conveniently describing the operation of the word line reset circuit 78. Both of the voltage level reset units 100a, 100b correspond to the same circuit structure. Taking the voltage level reset unit 100a for example, the voltage level reset unit 100a includes two NOR gates 102a, 102b, an NAND gate 104, two inverters 106a, 106b, and two transistors 108a, 108b. As shown in FIG. 5, the word line driver 72a has 8 driving units. The word line reset circuit 78, therefore, has 8 voltage level reset units for outputting voltages $(Vrst)_0$–$(Vrst)_7$. In the preferred embodiment, the voltage level reset unit 100a is used to control the voltage level of the voltage $(Vrst)_0$, and the voltage level reset unit 100b is used to control the voltage level of the voltage $(Vrst)_7$. If the flash memory 60 performs the erasing operation, the input signal NEGWL corresponds to the logic value "1". No matter what the logic value associated with the decoding signal $XT_0$ is, an output port of the NOR gate 102a certainly corresponds to the logic value "0", and the logic value "0" is further delivered to the NAND gate 104 and the NOR gate 102b. Because one input port of the NAND gate 104 corresponds to the logic value "0", the node G certainly corresponds to the logic value "1".

At this time, both input ports of the NOR gate 102 correspond to the logic value "0", and the node H holds the logic value "1". In the end, the transistor 108a is turned off, but the transistor 108b is turned on for driving the voltage $(Vrst)_0$ to approach the grounding voltage. By the same means, when the input signal NEGWL corresponds to the logic value "1", other voltages $(Vrst)_1$–$(Vrst)_7$ are driven to the same grounding voltage. In other words, when the flash memory 60 runs the erasing operation, the voltage levels of the word lines $WL_0$–$WL_7$ are driven to be the voltage Vin (−7V) owing to the activated transistors 88b for the word lines $WL_0$–$WL_7$. Therefore, the transistors 88c correspond to the word lines $WL_0$–$WL_7$ do not need to be turned on, and the word line reset circuit 78 outputs the voltages $(Vrst)_1$–$(Vrst)_7$ equaling the grounding voltage to the gates of the transistors 88c within the driving units 83a, 83b, 83c.

If the flash memory 60 performs the programming operation or the reading operation, the input signal NEGWL corresponds to the logic value "0". When the memory cells 80 located at the word line $WL_0$ driven by the word line driver 72a need to be programmed or read, the word line driver 72a, as mentioned above, is selected, and the decoding signal $XT_0$ corresponds to the logic value "1". The driving voltage output circuit 74 shown in FIG. 7 drives the voltage $(Vin)_0$ to approach +8.5V for the programming operation or +3V for the reading operation, and the voltage $(Vin)_0$ is then passed to the target word line $WL_0$ through the transistor 88a. Because the transistor 88a is a PMOS transistor, and the voltage $(Vin)_0$ is a positive voltage, the transistor 88a passes the logic value "1" to the word line $WL_0$ with better transmission performance. Obviously, the transistor 88c does not need to be turned on. No matter what the logic value associated with the decoding signal $XT_0$ is, an output port of the NOR gate 102 certainly corresponds to the logic value "0". The logic value "0" is further delivered to the NAND gate 104 and the NOR gate 102b. Because one input port of the NAND gate 104 corresponds to the logic value "0", the node G certainly corresponds to the logic value "1". At this time, both input ports of the NOR gate 102 correspond to the logic value "0", and the node H holds the logic value "1". In the end, the transistor 108a is turned off, but the transistor 108b is turned on for driving the voltage $(Vrst)_0$ to approach the grounding voltage.

If the memory cells 80 located at the word line $WL_1$ driven by the word line driver 72a need to be programmed or read, the word line driver 72, as mentioned above, is enabled, and the decoding signal $XT_1$ corresponds to the logic value "1". However, the unselected decoding signal $XT_0$ then corresponds to the logic value "0". In addition, the driving voltage output circuit 74 shown in FIG. 4 drives the voltage $(Vin)_0$ to approach 0V for the programming operation and the reading operation. Therefore, the voltage $(Vin)_0$ is passed to the word line $WL_0$ through the transistor 88a. Because the transistor 88a is a PMOS transistor that has poor transmission performance for the logic value "0", and the voltage $(Vin)_0$ corresponds to the grounding voltage, the transistor 88c needs to be turned on to help the transistor 88a drive the word line $WL_0$ to approach the grounding voltage. With regard to the voltage level reset unit 100a, the output port of the NOR gate 102a certainly corresponds to the logic value "1" owing to the decoding signal $XT_0$ equaling the logic value "0". The logic value "1" is further delivered to the NAND gate 104 and the NOR gate 102b. Because one input port of the NOR gate 102b corresponds to the logic value "1", the node H certainly corresponds to the logic value "0". At this time, both input ports of the NAND gate 104 correspond to the logic value "1", and the node G holds the logic value "0". In the end, the transistor 108b remains off, but the transistor 108a is turned on for driving the voltage $(Vrst)_0$ to approach the voltage Vdd such as +3V. The transistor 88c, therefore, is activated now. Because the transistor 88c is an NMOS transistor with better transmission performance for deliving the logic value "0", the voltage level of the word line $WL_0$ becomes the grounding voltage perfectly.

Please note that the same driving voltage output circuit 74 in the preferred embodiment is used to drive all of the word line drivers 72a, 72b in the row driver 68. For instance, the voltage $(Vin)_0$ generated from the output unit 94a of the driving voltage output circuit 74 is delivered to the word line drivers 72a, 72b simultaneously. If the memory cells 80 at the word line $WL_0$ of the word line driver 72b need to be programmed, the voltage $(Vin)_0$ is then passed to the word line $WL_0$ of the word line driver 72b. However, the memory cells 80 at the word line $WL_0$ of the word line driver 72a do not need to be programmed. As mentioned above, the same voltage $(Vin)_0$ is outputted to the word line driver 72a as well. Though the voltage $(Vin)_0$ is +8.5V at this time, the word line driver 72a is not enabled because the memory cells 80 at the word line $WL_0$ of the word line driver 72a do not need to be programmed. Concerning the driving unit 83a, the transistor 88a still remains off so that the voltage $(Vin)_0$ can not be used by the driving unit 83a to drive the corresponding word line $WL_0$. In other words, the all of the word line drivers 72a, 72b in the row driver 68 function correctly even though the preferred embodiment adopts an identical driving voltage output circuit 74 to drive them. Similarly, one substrate voltage controller 76 and one word line reset circuit 78 are used to correctly drive all of the word line drivers 72a, 72b in the row driver 68.

In contrast to the prior art, the claimed flash memory fabricated by a complementary metal oxide semiconductor (CMOS)process provides only one driving voltage output circuit to drive a plurality of word line drivers. According to the prior art word line driver 42a shown in FIG. 3 capable of controlling 8 word lines $WL_0$–$WL_7$, it requires 90 transistors to implement the prior art word line driver. However, according to the claimed word line driver 72a shown in FIG.

5 capable of controlling the same 8 word lines $WL_0$–$WL_7$, it only requires 40 transistors to implement the claimed word line driver. Therefore, if the claimed word line driver is applied in a flash memory having N (512 for example) word lines, the claimed word line driver compared with the prior art word line driver is capable of saving much more transistors. It is noteworthy that the claimed flash memory additionally requires one driving voltage output circuit, one substrate voltage controller, and one word line reset circuit to control operations of the word line drivers. Overall, the total amount of transistors used in the claimed flash memory is less than the total amount of transistors used in the prior art flash memory. To sum up, the claimed flash memory has a smaller size and lower production cost owing to fewer fabricated transistors.

What is claimed is:

1. A non-volatile memory comprising:
   a plurality of memory blocks, each of the memory blocks comprising a plurality of word lines, each of the word lines being electrically connected to a plurality of memory cells;
   a first decoder for decoding a memory address to generate a plurality of first decoding signals;
   a second decoder for decoding the memory address to generate a plurality of second decoding signals; and
   a row driver for driving a predetermined word line to approach a predetermined voltage level, the row driver comprising:
   a plurality of word line drivers electrically connected to the first decoder and the second decoder, each of the word line drivers comprising:
   a plurality of driving units, each of the driving units being electrically connected to a word line; and
   a memory block selector electrically connected to the driving units for turning on the driving units according to the first decoding signals; and
   a driving voltage output circuit electrically connected to the driving units for determining a plurality of driving voltages according to the second decoding signals without using the first decoding signals, and outputting a predetermined driving voltage to drive the predetermined word line to approach the predetermined voltage level when a driving unit connected to the predetermined word line is turned on to electrically connect the predetermined word line and the driving voltage output circuit.

2. The non-volatile memory of claim 1 being a flash memory.

3. The non-volatile memory of claim 1 being fabricated through a complementary metal oxide semiconductor (CMOS) process.

4. The non-volatile memory of claim 3 wherein each of the driving units comprises:
   a PMOS transistor comprising:
   a drain electrically connected to a driving voltage;
   a source electrically connected to a word line; and
   a gate electrically connected to a first output port of the memory block selector; and
   a first NMOS transistor comprising:
   a drain electrically connected to the source of the PMOS transistor;
   a source electrically connected to a specific voltage; and
   a gate electrically connected to a second output port of the memory block selector.

5. The non-volatile memory of claim 4 wherein the PMOS transistor is formed on an n-type substrate, and the first NMOS transistor is formed on a p-type substrate.

6. The non-volatile memory of claim 5 wherein the p-type substrate is electrically connected to the source of the first NMOS transistor, and the row driver further comprises a substrate voltage controller electrically connected to the n-type substrate for outputting a control voltage to the n-type substrate.

7. The non-volatile memory of claim 6 wherein if the non-volatile memory runs a reading operation or a programming operation, the control voltage corresponds to a first voltage level, and if the non-volatile memory runs an erasing operation, the control voltage corresponds to a second voltage level.

8. The non-volatile memory of claim 7 wherein the first voltage level is higher than the second voltage level.

9. The non-volatile memory of claim 4 wherein each of the driving units further comprises a second NMOS transistor, and the second NMOS transistor comprises a drain electrically connected to the source of the PMOS transistor, a source electrically connected to the specific voltage, and a gate.

10. The non-volatile memory of claim 9 further comprising a word line reset circuit electrically connected to the gate of the second NMOS transistor for outputting a control voltage to the gate of the second NMOS transistor.

11. The non-volatile memory of claim 10 wherein if the non-volatile memory runs an erasing operation, the control voltage outputted from the word line reset circuit is unable to turn on the second NMOS transistor.

12. The non-volatile memory of claim 11 wherein the non-volatile memory runs a reading operation or a programming operation, and a word line associated with the driving unit is selected, the control voltage outputted from the word line reset circuit is unable to turn on the second NMOS transistor.

13. The non-volatile memory of claim 4 wherein if the memory block selector selects the driving units, the first output port of the memory block corresponds to a first voltage to turn on the PMOS transistor, and if the memory block selector does not select the driving units, the first output port of the memory block corresponds to a second voltage to turn off the PMOS transistor.

14. The non-volatile memory of claim 4 wherein if the memory block selector selects the driving units, the second output port of the memory block corresponds to a first voltage to turn off the NMOS transistor, and if the memory block selector does not select the driving units, the second output port of the memory block corresponds to a second voltage to turn on the PMOS transistor.

* * * * *